(12) United States Patent
Shi et al.

(10) Patent No.: US 11,617,025 B2
(45) Date of Patent: Mar. 28, 2023

(54) WIDE DYNAMIC RANGE CMOS IMAGE SENSOR

(71) Applicant: SmartSens Technology (HK) Co., Ltd, Kwun Tong Kowloon (HK)

(72) Inventors: Wenjie Shi, Shanghai (CN); Binghui Tan, Shanghai (CN); Wanqing Wang, Shanghai (CN)

(73) Assignee: SmartSens Technology (HK) Co., Ltd., Kwun Tong Kowloon (HK)

( * ) Notice: Subject to any disclaimer, the term of this patent is extended or adjusted under 35 U.S.C. 154(b) by 0 days.

(21) Appl. No.: 17/484,234

(22) Filed: Sep. 24, 2021

(65) Prior Publication Data
US 2023/0007898 A1  Jan. 12, 2023

(30) Foreign Application Priority Data
Jul. 8, 2021 (CN) .......................... 202110775613.2

(51) Int. Cl.
| | |
|---|---|
| H04N 25/57 | (2023.01) |
| H04N 25/75 | (2023.01) |
| H04N 25/13 | (2023.01) |
| H04N 25/585 | (2023.01) |
| H04N 25/621 | (2023.01) |
| H04N 25/702 | (2023.01) |
| H01L 27/146 | (2006.01) |

(52) U.S. Cl.
CPC .......... *H04N 25/57* (2023.01); *H04N 25/134* (2023.01); *H04N 25/585* (2023.01); *H04N 25/621* (2023.01); *H04N 25/702* (2023.01); *H04N 25/75* (2023.01); *H01L 27/14605* (2013.01); *H01L 27/14623* (2013.01); *H01L 27/14629* (2013.01)

(58) Field of Classification Search
CPC .... H04N 5/355; H04N 5/35563; H04N 5/359; H04N 5/3591; H04N 5/3595; H04N 5/3696; H04N 5/378; H04N 9/04557; H01L 27/14605; H01L 27/14623; H01L 27/14629
See application file for complete search history.

(56) References Cited

U.S. PATENT DOCUMENTS

| | | | |
|---|---|---|---|
| 9,590,005 B1* | 3/2017 | Qian | H01L 27/14643 |
| 2009/0109307 A1* | 4/2009 | Nishida | G02B 5/008 348/294 |
| 2019/0131333 A1* | 5/2019 | Borthakur | H01L 27/14605 |
| 2020/0099846 A1* | 3/2020 | Cheng | H04N 5/2353 |
| 2021/0202546 A1* | 7/2021 | Liu | H01L 27/1463 |

* cited by examiner

*Primary Examiner* — Daniel M Pasiewicz
(74) *Attorney, Agent, or Firm* — Eric Karich; Karich & Associates (57) ABSTRACT

A CMOS image sensor with an imaging array of pixels containing selected pixels wherein illumination is blocked and light scattered from an adjacent pixel is collected. The signal from the selected pixels is resilient against saturation and thereby contributes to increased dynamic range of the imaging signal. The image sensor may be incorporated within a digital camera.

24 Claims, 4 Drawing Sheets

WIDE DYNAMIC RANGE CMOS IMAGE SENSOR

BACKGROUND OF THE INVENTION

Field of the Invention

This invention relates generally to image sensors, and more particularly to CMOS image sensors High Dynamic Range (HDR). An imaging array of pixels contain selected pixels wherein illumination is blocked and light scattered from an adjacent pixel is collected. The signal from the selected pixels is resilient against saturation and thereby contributes to increased HDR. The image sensor may be incorporated within a digital camera.

Description of Related Art

An image capture device includes an image sensor and an imaging lens. The imaging lens focuses light onto the image sensor to form an image, and the image sensor converts the light into electrical signals. The electric signals are output from the image capture device to other components of a host electronic system. The image capture device and the other components of a host electronic system form an imaging system. Image sensors have become ubiquitous and may be found in a variety of electronic systems, for example, a mobile device, a digital camera, a medical device, or a computer.

A typical image sensor comprises a number of light sensitive picture elements ("pixels") arranged in a two-dimensional array. Such an image sensor may be configured to produce a color image by forming a color filter array (CFA) over the pixels. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors. However, miniaturization has come with the loss of pixel photosensitivity and dynamic range which require new approaches in order to mitigate.

With the decreased pixel size, the total light absorption depth within the substrate becomes insufficient for some light, especially long-wavelength light. This becomes a particular problem for image sensors using backside illumination (BSI) technology wherein the image light is incident upon the backside of the sensor substrate. In BSI technology the sensor Silicon substrate may be only two microns (micrometers) thick which is adequate to absorb blue light but very inadequate to absorb red light which may require ten microns of thickness to be fully absorbed.

Two of the most common exposure methods for the image signals generated on a sensor chip are the rolling shutter mode and the global shutter mode. The rolling shutter mode involves exposing different lines of the sensor array at different times and reading out those lines in a chosen sequence. The global shutter mode involves exposing each pixel simultaneously and for the same length of time similar to how a mechanical shutter operates on a legacy "snapshot" camera.

Rolling shutter (RS) mode exposes and reads out adjacent rows of the array at different times, that is, each row will start and end its exposure slightly offset in time from its neighbor. The readout of each row follows along each row after the exposure has been completed and transfers the charge from each row into the readout node of the pixel. Although each row is subject to the same exposure time, the row at the top will have ended its exposure a certain time prior to the end of the exposure of the bottom row of the sensor. That time depends on the number of rows and the offset in time between adjacent rows. A potential disadvantage of rolling shutter readout mode is spatial distortion which results from the above. The distortion becomes more apparent in cases where larger objects are moving at a rate that is faster than the readout rate. Another disadvantage is that different regions of the exposed image will not be precisely correlated in time and appear as a distortion in the image. To improve signal to noise in the image signal final readout, specifically to reduce temporal dark noise, a reference readout called correlated double sampling (CDS) is performed prior to the conversion of each pixel charge to an output signal by an amplifier transistor. The amplifier transistor may typically be a transistor in a source-follower (SF) or common drain configuration wherein the pixel employs a voltage mode readout. However, there are advantages to incorporating a common source amplifier wherein the pixel employs a current mode readout. The common source amplifier may be used in large area imagers. The current of the photodiode is amplified and the readout circuits integrate the current on a capacitor to a voltage, which is then converted to the digital domain.

Global shutter (GS) mode exposes all pixels of the array simultaneously. This facilitates the capture of fast moving events, freezing them in time. Before the exposure begins all the pixels are reset (RST) to the same ostensibly dark level by draining all their charge. At the start of the exposure each pixel begins simultaneously to collect charge and is allowed to do so for the duration of the exposure time. At the end of the exposure each pixel transfers charge simultaneously to its readout node. Global shutter mode can be configured to operate in a continuous manner whereby an exposure can proceed while the previous exposure is being readout from the readout storage nodes of each pixel. In this mode the sensor has 100% duty cycle which optimizes time resolution and photon collection efficiency. There is no artifact in the image of the period of transient readout that occurs in global shutter mode.

Global shutter can be regarded as essential when exact time correlation is required between different regions of the sensor area. Global shutter is also very simple to synchronize with light sources or other devices.

Global shutter mode demands that a pixel contain at least one more transistor or storage component than a pixel using rolling shutter mode. Those extra components are used to store the image charge for readout during the time period following simultaneous exposure. Again in order to improve signal to noise in the image signal a reference readout is required not only to be performed prior to the conversion of each pixel charge to an output signal by an amplifier transistor but also prior to the transfer of the pixel charge to the extra components of the pixel used to store the image charge during readout.

In summary, rolling shutter can deliver the lowest read noise and is useful for very fast streaming of data without synchronization to light sources or peripheral devices. However it carries risk of spatial distortion especially when imaging relatively large, fast moving objects. There is no risk of spatial distortion when using global shutter and when synchronizing to fast switching peripheral devices it is relatively simple and can result in faster frame rates. Flexibility to offer both rolling shutter and global shutter can be very advantageous.

Irrespective of the readout method it is possible for CMOS image sensors to periodically miss sampling part of an image wherein the scene includes, for example, light source (e.g., LED) illumination, wherein the LED is operated in Pulse Width Modulation (PWM) mode. It is also possible that in the same scene there are very bright objects wherein a longer exposure time to capture the PWM LED would saturate the imaging of the bright object. An important design metric in image sensors is dynamic range, which is defined as the logarithmic ratio between the largest non-saturating photocurrent and the smallest detectable photocurrent. For a sensor with a fixed saturation charge, also referred to as well capacity, saturation limits the highest signal. Generally, the smallest detectable photocurrent is dominated by reset sampling noise of the photodiode and the floating diffusion. Dynamic Range was defined in order to describe the capability of an image sensor to capture such variant scenes as 20.log (S/N), where S is the maximum illumination tolerated by the sensor without saturating and N the noise measured on a pixel with no illumination falling on it. In several applications, such as automotive applications, the roughly 60 dB dynamic range of a standard CMOS image sensor does not allow retention of all the relevant information content of a captured scene.

An opportunity exists for improvement of image sensors in which the pixel array has sufficient dynamic range to capture all the objects within a scene but not become saturated. Another opportunity for improvement of image sensors arises when certain components are employed within the pixel array to enhance its ability to adequately image both high lights and dark shadows in a scene. The present invention fulfills these needs and provides further advantages as described in the following summary.

SUMMARY OF THE INVENTION

The present invention teaches certain benefits in construction and use which give rise to the objectives described below.

The present invention provides an image sensor pixel array comprising at least two types of pixels. The first type of pixel includes an opaque or light-blocking layer in the illumination path while the second type of pixel is the same as the first in all respects except that there is no light-blocking layer. The shading rate of the opaque or light-blocking layer is greater than 98%. The two types of pixels are immediately adjacent to each other. Typically they will be under the same color of color filter. If any signal is derived from the first type of pixel it is presumed to be due to light scattered into it from the adjacent pixel(s) of the second type. One way light may be scattered into the first type pixel into the second type of pixel is by diffraction. Also typically in the prior art collecting light in one pixel from an adjacent pixel is undesirable. Since the scattering between pixels is typically weak in a well-designed pixel the response of the first type of pixel is weak and cannot reach photodiode full well condition during prolonged exposure times or when exposed to very high illumination. It is then possible to operate the first type pixel with longer exposure time than the second type pixel for example. It is also possible to operate the first type pixel the same exposure time with the second type pixel, as well, to collect highlight flicker signals through the first type of pixels, and collect surrounding dark signals through the second type of pixels. The first type of pixel effectively acts as if it has an attenuated sensitivity to local light illumination compared to the pixel(s) adjacent to it. Light flicker mitigation (LFM) may be achieved in this way. This invented technique and pixel array may perform to increase HDR as does a method such as using adjacent large and small area pixels.

In practice a readout solution may not necessarily involve directly adding the signals of the two types of pixels to obtain image information, although that is one possibility. For example, the signal of the first type of pixel may be obtained in one frame, and the signal of the second type of pixel may be obtained in another frame, so as to obtain an ideal result in the subsequent image processing. Therefore, the solution of the present invention can provide these two kinds of signals, and those skilled in the art can adopt existing exposure methods, pixel circuits, readout circuits, etc. to meet their needs according to actual needs.

A primary objective of the present invention is to provide an image sensor pixel having advantages not taught by the prior art. Another objective is to provide a pixel array that occupies achieves high dynamic range with a simple manufacturing methodology and reduce manufacturing cost for an HDR image sensor. Another objective of the present invention is to provide light flicker mitigation (LFM).

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above-described drawing figures illustrate the invention, an image sensor with pixel array with signal dynamic range enhancement components.

Various embodiments of the image sensor are disclosed herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects. A substrate may have a front side and a back side. Any fabrication process that is performed from the front side may be referred to as a frontside process while any fabrication process that is performed from the back side may be referred to as a backside process. Structures and devices such as photodiodes and associated transistors may be formed in the substrate from a front surface of a substrate. A dielectric stack that includes alternating layers of metal routing layers and conductive via layers may be formed on the front surface of a substrate.

The terms "coupled" and "connected," which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly coupled by way of a metal line, or indirectly connected by way of an intervening circuit element (e.g., a capacitor, resistor, or by way of the source/drain terminals of a transistor). In the present invention electrical interconnects on the chip will most commonly be formed on the front sides of the chip. When reference is made to certain circuit elements residing within or formed in a substrate this is generally accepted to mean the circuits reside on the front side of the substrate. The term "opaque" means blocking the passage of radiant energy and especially light: exhibiting opacity. Herein opaque means more than 98% of light is blocked. The term "adjacent" means next to or adjoining something else. The term "scattered" means redirected as light scattered and/or diffract from one pixel into an adjacent one.

Figure 1:
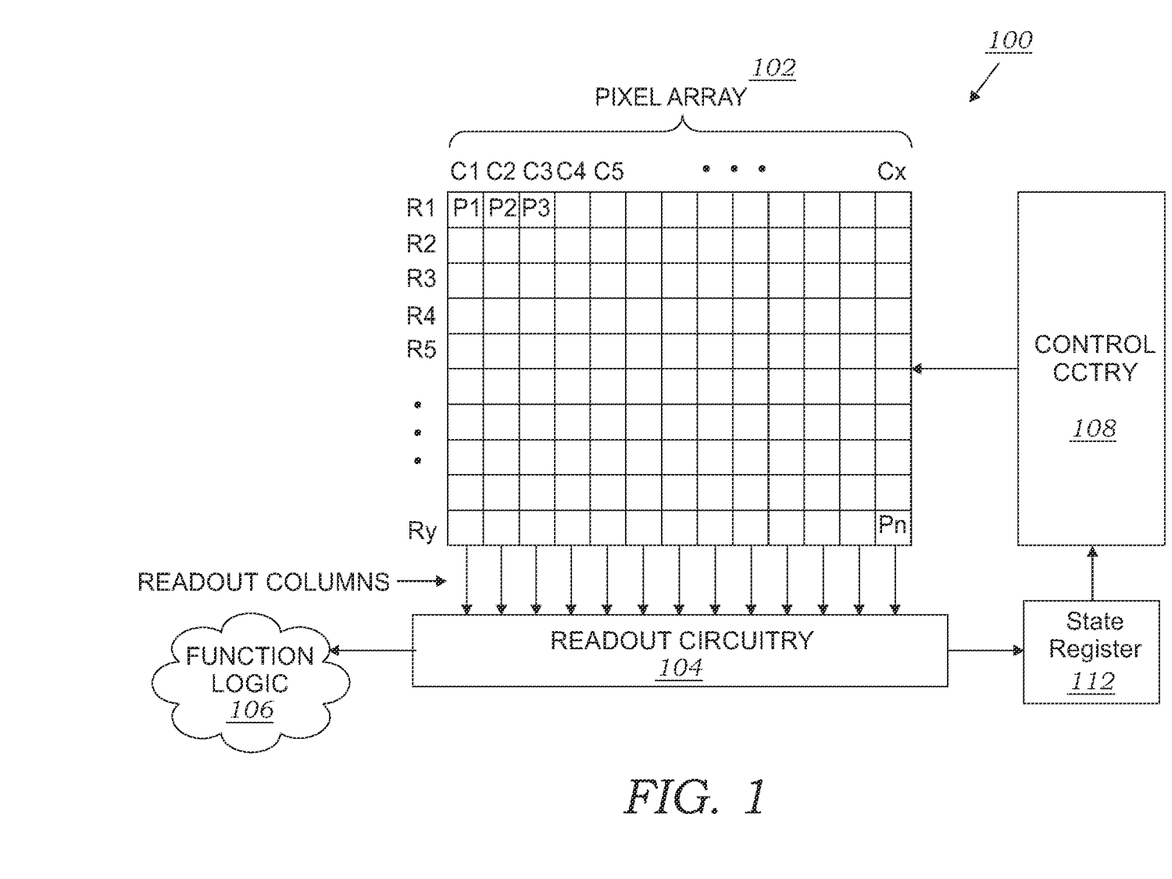
FIG. 1 is a diagram illustrating one example of an imaging system including a pixel array having improved high dynamic range included in an integrated circuit system, according to one embodiment of the present invention.

FIG. 1 is a diagram illustrating one example of an imaging system 100 including an example pixel array 102 having a plurality of image sensor pixels included in an example integrated circuit system with features in accordance with the teachings of the present invention. As shown in the depicted example, imaging system 100 includes pixel array 102 coupled to control circuitry 108 and readout circuitry 104, which is coupled to function logic 106. Control circuitry 108 and readout circuitry 104 are in addition coupled to state register 112. In one example, pixel array 102 is a two-dimensional (2D) array of image sensor pixels (e.g., pixels P1, P2 . . . , Pn). As illustrated, each pixel is arranged into a row (e.g., rows R1 to Ry) and a column (e.g., column C1 to Cx) to acquire image data of a person, place, object, etc., which can then be used to render a 2D image of the person, place, object, etc.

In one example, after each pixel has acquired its image data or image charge, the image data is readout by readout circuitry 104 using a readout mode specified by state register 110 and then transferred to function logic 106. In various examples, readout circuitry 104 may include amplification circuitry, analog-to-digital (ADC) conversion circuitry, or otherwise. State register 112 may include a digitally programmed selection system to determine whether readout mode is by rolling shutter or global shutter. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated) or may readout the image data using a variety of other techniques (not illustrated), such as a serial readout or a full parallel readout of all pixels simultaneously. In one example, control circuitry 108 is coupled to pixel array 102 to control operational characteristics of pixel array 102. Some aspects of the operation of control circuitry 108 may be determined by settings present in state register 112. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
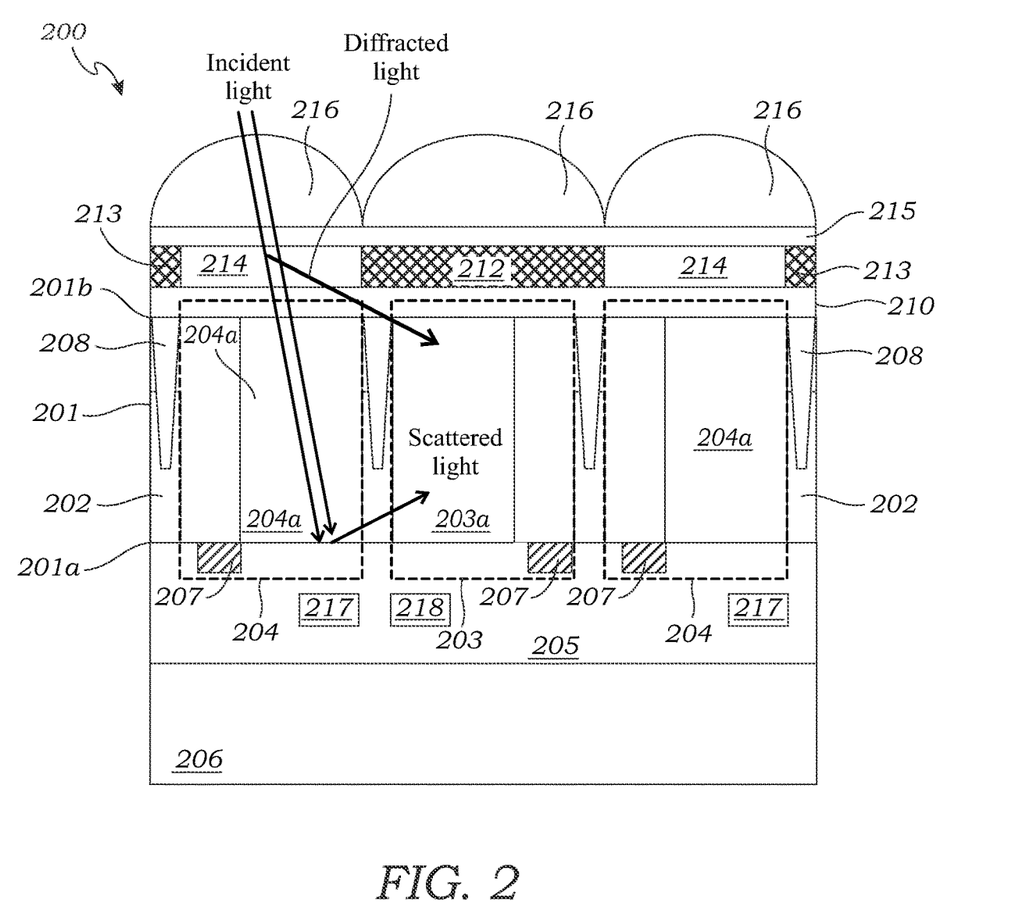
FIG. 2 is a cross section diagram of a portion of an image sensor pixel array, according to an embodiment of the invention.

FIG. 2 is a cross section diagram of a portion of an image sensor pixel array 200 according to an embodiment of the invention. FIG. 2 illustrates three adjacent pixels of array 200 wherein the center pixel includes an opaque light blocking feature 212. Image sensor pixel array 200 is fabricated as follows. Silicon Semiconductor substrate 201 is the starting material with frontside 201a and backside 201b. Photosensitive region isolation regions are formed by doping regions 202. Photosensitive regions 203a and 204a are formed in substrate 201 while readout circuit components 207 are formed on frontside 201a. Metal interconnects 217 and 218 are also formed on frontside 201a and covered with dielectric layer 205 which is planarized by polishing. Pixel circuits 204 which comprise photosensitive regions 204a and readout circuit components 207 may be identical to pixel circuits 203 in all respects but in the embodiment of the invention illustrated pixel circuits 203 are a mirror image of the adjacent pixel circuits to facilitate optimum collection of scattered light. Handle wafer 206 is attached to dielectric layer 205 following its planarization and then the majority of substrate 201 is polished away reaching backside 201b. Next photosensitive region isolation regions are formed by deep trench isolation regions 208. Dielectric passivating and first anti-reflecting layer 210 is formed on backside 201b and a metal layer is formed on top of layer 210 wherein metal grids 213, void regions 214 and opaque light-blocking feature 212 are patterned from the metal layer. Light reflecting feature 212 may be a metal feature comprised of elements W, Al, Ti, TIN, Ta, TaN and other materials and combinations thereof. Light reflecting feature 212 and metal grids 213 can be formed in the same process at the same time, or can be prepared in different process steps. A color filter layer 215 is formed on top of the metal layer patterns and finally microlenses 216 are formed above each of the pixel circuits. In most instances the color filter array positioned over the entire pixel array will be comprised of a Bayer Pattern of Red, Green and Blue (RGB) filters. In a first embodiment of the invention adjacent pixels 204a and 203a reside under the same color of color filter. FIG. 2 illustrates illumination from a scene to be captured by the image sensor falling as incident light onto a pixel circuit 204 where it is partially absorbed within photosensitive region 204a and partially reflected off the frontside 201a and scattered into photosensitive region 203a of pixel circuit 203. Additionally a portion of the incident light is diffracted at backside 201b and also scattered into photosensitive region 203a. FIG. 2 then illustrates the first embodiment of the invention wherein among an array of pixel there lies a grouping of pixels wherein.

Figure 3:
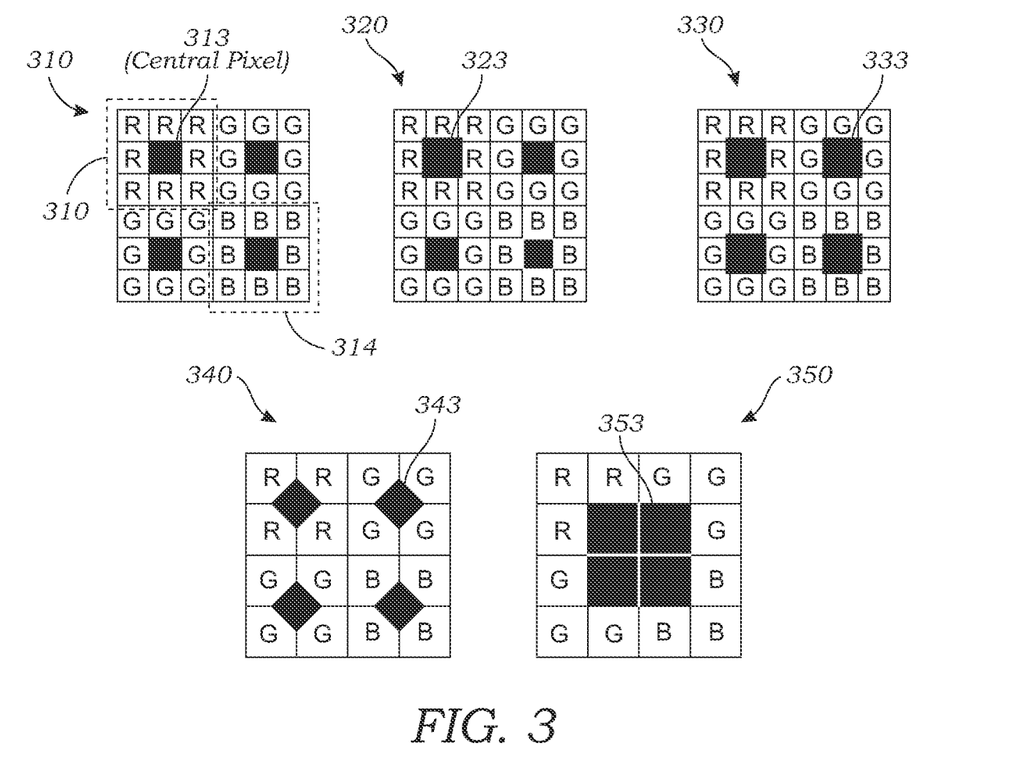
FIG. 3 is a diagram indicating pixel array layouts according to one embodiment of the invention.

FIG. 3 is a diagram indicating pixel array layouts according to embodiments of the invention. Pixel sub-array 310 is illustrated in FIG. 3 and it consists of a six by six rectangular array of imaging pixels. Pixel sub-array 310 is partitioned into a Bayer color filter pattern with the upper left nine pixels covered by red (R) color filter material, the lower right nine pixels covered by blue (B) color filter material and the nine pixels in the upper right and lower left covered by green (G) color filter material. Rectangular pixel sub-array 310 with its three color regions provides the necessary imaging signal information to determine the color and intensity to be assigned to a point within the scene being imaged by the image sensor. The three by three pixel sub-group 312 consists of nine pixels covered with red (R)

color filter material. The central pixel 313 is the only pixel that is also covered with an opaque light-blocking layer. Pixel 313 is directly adjacent or diagonally adjacent to all the other pixels of the pixel sub-group and according to an embodiment of the invention it may receive scattered light from those adjacent pixels and upon an appropriate readout its signal may enhance the dynamic range of the pixel sub-group. The three by three pixel sub-group 314 is exactly the same as pixel sub-group 312 except that it is covered by blue filter material. The remaining two pixel sub-groups are also the same as pixel sub-group 312 except that they are covered by green filter material as is the custom of Bayer color patterns. Finally it is emphasized that pixel 313 is the same size (area) and orientation as the other pixels within its pixel sub-group.

On the other hand, FIG. 3 illustrates an alternate embodiment of the invention in pixel sub-array 330 which is similar to pixel sub-array 310 but pixels 333, which have opaque light-blocking layers, whose opaque light-blocking feature are shown to be larger is size (area) than the area of the pixels in sub-array 330 while pixels 333 and the other adjacent pixels have the same size. FIG. 3 also illustrates another alternate embodiment of the invention in pixel sub-array 320 which is similar to pixel sub-array 310 except that pixels 323, which have opaque light-blocking layers, have different light-blocking layers sizes in the red and blue pixel sub-groups and equivalent light-blocking layers sizes in the green pixel sub-groups. That is the light-blocking layers sizes for red pixel is larger than that of the green pixel, and the light-blocking layers sizes for green pixel is larger than that of the blue pixel. At the same time, all pixels in those pixel sub-groups have the same size except for light-blocking layers sizes. The embodiment is to balance the scattered light from the second type of pixels to the first type of pixel due to the red light has the best scattering ability while blue light has the worst scattering ability.

FIG. 3 also illustrates another alternate embodiment of the invention in pixel sub-array 340 which is a four by four pixel array with a Bayer color filter pattern but has pixels 343, which have opaque light-blocking layers and have their rectangular shapes rotated 45 degrees from their adjacent pixels inserted within each two by two pixel sub-group with the same color of color filter. Yet another alternate embodiment of the invention is illustrated in pixel sub-array 350 which is a four by four pixel array of equally sized pixels with a Bayer color filter pattern but has pixels 353, which have opaque light-blocking layers, comprise four of the 16 pixels in the array with one pixel 353 type pixel in each block of four pixels under the same color of color filter. An appropriate readout scheme is required for each of the invented pixel arrays described herein in order to realize the claimed benefits of wider dynamic range resulting in the acquired image representation.

Figure 4:
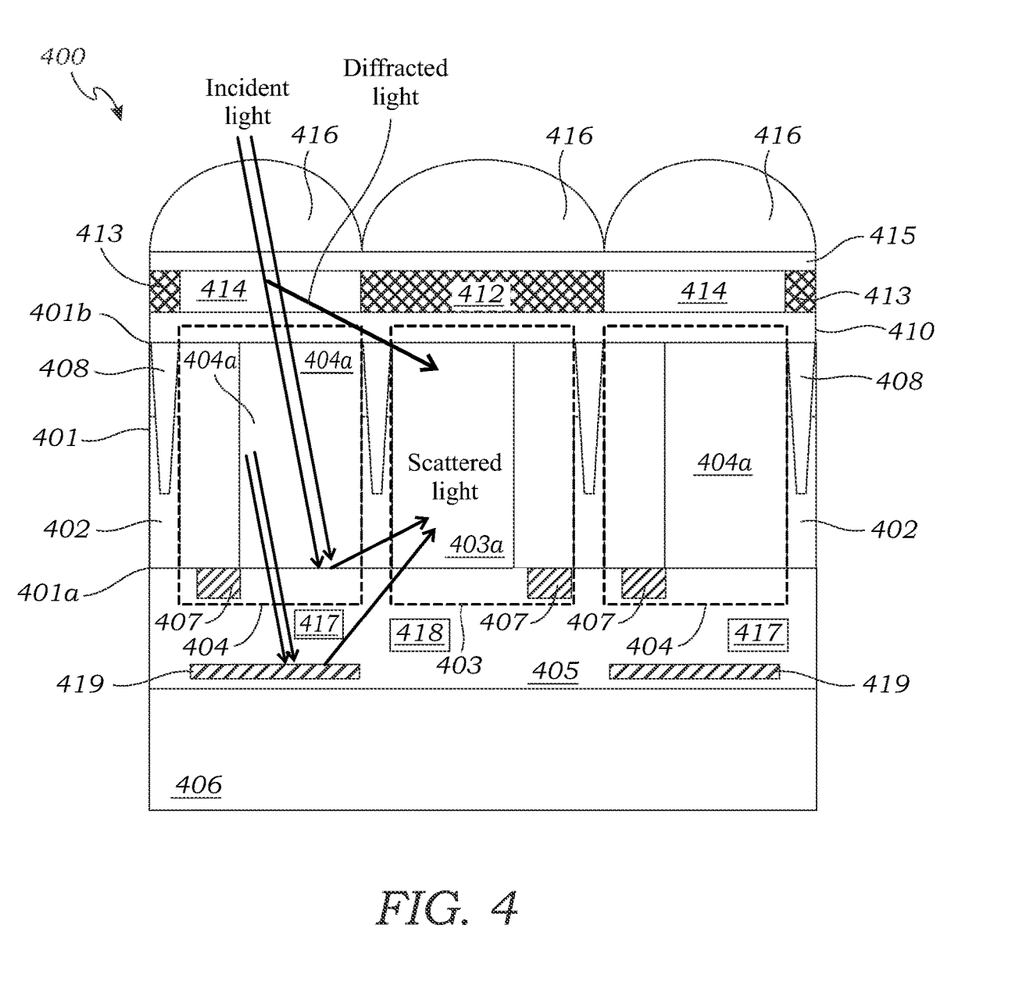
FIG. 4 is a cross section diagram of a portion of an image sensor pixel array, according to another embodiment of the invention.

FIG. 4 is a cross section diagram of a portion of an image sensor pixel array 400 according to an embodiment of the invention. FIG. 4 illustrates three adjacent pixels of array 400 wherein the center pixel includes an opaque light-blocking feature 412 which is in every respect the same as image sensor pixel array 200 shown in FIG. 2 except that light-reflecting feature 419 has been added. Light-reflecting feature 419 is formed within dielectric layer 405 during the metal interconnect fabrication steps which are normal and usual to integrated circuit and pixel circuit fabrication. Light reflecting feature 419 may be a metal feature comprised of elements W, Al, Ti, TIN, Ta, TaN and other materials and combinations thereof.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An imaging array of pixels, comprising:
   a first semiconductor substrate having a frontside and a backside and an array of imaging pixels fabricated therein to collect illumination from a scene and convert it into an imaging signal, wherein the array of imaging pixels comprising at least two adjacent pixels wherein the first type of pixel includes an opaque light-blocking layer in the illumination path; and
   an imaging signal readout circuit wherein the imaging signals from light scattered into the first type of pixels from the second type of pixels is read out to form an image that is representative of an image formed from the signals from the second type of pixels but with reduced blooming or flicker.

2. The imaging array of pixels of claim 1, wherein the opaque light-blocking layer of the first type of pixel resides among the layers on the backside of the substrate and is opaque to incident light.

3. The imaging array of pixels of claim 2, wherein the opaque light-blocking layer of the first type of pixel resides between semiconductor substrate and color filter.

4. The imaging array of pixels of claim 1, wherein the second type of pixel contains, among the interconnect layers on the frontside of the substrate, a light-reflecting feature that reflects illumination incident upon the second type of pixel into the first type of pixel.

5. The imaging array of pixels of claim 1, wherein a color filter is disposed among the layers on the backside of the substrate between the pixels and the scene and wherein the color of the color filter over the adjacent first and second types of pixels is the same color.

6. The imaging array of pixels of claim 5, wherein the light-blocking layers sizes for red pixel is layer than that of the green pixel, and the light-blocking layers sizes for green pixel is layer than that of the blue pixel.

7. The imaging array of pixels of claim 5, wherein the array of pixels comprises a first three by three pixel sub-array of pixels and wherein the center pixel is one of the first type of pixel and the eight periphery pixels are of the second type of pixel.

8. The imaging array of pixels of claim 7, wherein the array of pixels comprises a two by two array of the first three by three pixel sub-arrays wherein one sub-array is covered with red color filter material and a second sub-array is covered by blue color filter material and the remaining two sub-arrays are covered by green color filters and wherein the color filters on the four sub-arrays forms a Bayer color filter pattern.

9. The imaging array of pixels of claim 8, wherein the first type of pixel and the second type of pixel are the same in all respects except that there is no light-blocking layer.

10. The imaging array of pixels of claim 9, wherein the area of light-blocking layers of the first type of pixels present a different area toward the illumination from the scene as the area of the first type of pixel.

11. The imaging array of pixels of claim 5, wherein the array comprises a first two by two pixel sub-array of pixels and wherein one pixel of each of the sub-arrays is one of the first type of pixel and the three remaining pixels of each sub-array are of the second type of pixel.

12. The imaging array of pixels of claim 11, wherein the array comprises a two by two array of the first two by two pixel sub-arrays wherein one sub-array is covered with red color filter material and a second sub-array is covered by blue color filter material and the remaining two sub-arrays are covered by green color filters and wherein the color filters on the four sub-arrays forms a Bayer color filter pattern.

13. The imaging array of pixels of claim 12, wherein of the sixteen pixels the four pixels in the center of the two by two array of pixels are the first type pixel and the twelve periphery pixels of the two by two array are pixels of the second type.

14. The imaging array of pixels of claim 5, wherein the array of pixels comprises a first two by two pixel sub-group of pixels and also has one pixel which has opaque light-blocking layer and has its rectangular shape rotated 45 degrees from their adjacent pixels inserted within each two by two pixel sub-group with the same color of color filter and the four adjacent pixels of each sub-array are of the second type of pixel.

15. A method to provide reduced blooming or flicker of an imaging signal, the method comprising the steps of:
providing an array of imaging pixels fabricated in a semiconductor substrate to collect illumination from a scene and convert it into an imaging signal, wherein the array of imaging pixels comprising at least two adjacent pixels wherein the first type of pixel includes an opaque light-blocking layer in the illumination path; and providing an imaging signal readout circuit wherein the imaging signal from light scattered into the first type of pixels from the second type of pixels higher is read out to form an image that is representative of an image formed from the signals from the second type of pixels but with reduced blooming or flicker.

16. The method of claim 15, wherein the opaque light-blocking layer of the first type of pixel resides among the layers on a backside of the substrate and is opaque to incident light.

17. The method of claim 16, wherein the opaque light-blocking layer of the first type of pixel resides between semiconductor substrate and color filter.

18. The method of claim 15, wherein the second type of pixel contains, among the interconnect layers on a frontside of the substrate, a light-reflecting feature that reflects illumination incident upon the second type of pixel into the first type of pixel.

19. The method of claim 15, wherein a color filter is disposed among the layers on a backside of the substrate between the pixels and the scene and wherein the color of the color filter over the adjacent first and second types of pixels is the same color.

20. The method of claim 19, wherein the array of pixels comprises a first three by three pixel sub-array of pixels and wherein the center pixel is one of the first type of pixel and the eight periphery pixels are of the second type of pixel.

21. The method of claim 20, wherein the array of pixels comprises a two by two array of the first three by three pixel sub-arrays wherein one sub-array is covered with red color filter material and a second sub-array is covered by blue color filter material and the remaining two sub-arrays are covered by green color filters and wherein the color filters on the four sub-arrays forms a Bayer color filter pattern.

22. An imaging array of pixels, comprising:
a first semiconductor substrate having a frontside and a backside and an array of imaging pixels fabricated therein to collect illumination from a scene and convert it into an imaging signal, wherein the array of imaging pixels comprising at least two adjacent pixels wherein the first type of pixel includes an opaque light-blocking layer in the illumination path; and
an imaging signal readout circuit wherein the imaging signals from light scattered into the first type of pixels from the second type of pixels is read out with one of, in a different frame or, with a different exposure time than the signals from the second type of pixels to form an image that is representative of an image formed from the signals from the second type of pixels but with reduced blooming or flicker.

23. A method to provide reduced blooming or flicker of an imaging signal, the method comprising the steps of:
providing an array of imaging pixels fabricated in a semiconductor substrate to collect illumination from a scene and convert it into an imaging signal, wherein the array of imaging pixels comprising at least two adjacent pixels wherein the first type of pixel includes an opaque light-blocking layer in the illumination path; and
providing an imaging signal readout circuit wherein the imaging signal from light scattered into the first type of pixels from the second type of pixels is read out at a different exposure time than the signals from the second type of pixels to form an image that is representative of an image formed from the signals from the second type of pixels but with reduced blooming or flicker.

24. A method to provide a higher dynamic range of an imaging signal, the method comprising the steps of:
   providing an array of imaging pixels fabricated in a semiconductor substrate to collect illumination from a scene and convert it into an imaging signal, wherein the array of imaging pixels comprising at least two adjacent pixels wherein the first type of pixel includes an opaque light-blocking layer in the illumination path; and
   providing an imaging signal readout circuit wherein the imaging signal from light scattered into the first type of pixels from the second type of pixels is read out in a different frame than the signals from the second type of pixels to form an image that is representative of an image formed from the signals from the second type of pixels but with reduced blooming or flicker.

\* \* \* \* \*